United States Patent
Hara et al.

(10) Patent No.: US 9,449,844 B2
(45) Date of Patent: Sep. 20, 2016

(54) ETCHING METHOD, ETCHING APPARATUS, AND STORAGE MEDIUM

(71) Applicants: TOKYO ELECTRON LIMITED, Tokyo (JP); HYOGO PREFECTURE, Hyogo (JP)

(72) Inventors: Kenichi Hara, Ibaraki (JP); Isao Yamada, Hyogo (JP); Noriaki Toyoda, Hyogo (JP); Takashi Hayakawa, Tokyo (JP)

(73) Assignees: TOKYO ELECTRON LIMITED, Tokyo (JP); HYOGO PREFECTURE, Hyogo (JP)

( * ) Notice: Subject to any disclaimer, the term of this patent is extended or adjusted under 35 U.S.C. 154(b) by 481 days.

(21) Appl. No.: 13/624,652

(22) Filed: Sep. 21, 2012

(65) Prior Publication Data
US 2013/0075248 A1 Mar. 28, 2013

(30) Foreign Application Priority Data

Sep. 21, 2011 (JP) .................... 2011-205544
Jul. 11, 2012 (JP) .................... 2012-155696

(51) Int. Cl.
| C23C 14/00 | (2006.01) |
| C23C 14/32 | (2006.01) |
| H01L 21/3213 | (2006.01) |
| C23F 4/02 | (2006.01) |
| H01L 21/3065 | (2006.01) |

(52) U.S. Cl.
CPC .......... *H01L 21/32136* (2013.01); *C23F 4/02* (2013.01); *H01L 21/3065* (2013.01)

(58) Field of Classification Search
CPC ................ H01L 21/30604; H01L 21/32136
See application file for complete search history.

(56) References Cited

FOREIGN PATENT DOCUMENTS

| JP | 2001319923 A | * | 11/2001 | ......... H01L 21/3065 |
| JP | 2009043975 A | * | 2/2009 | |
| JP | 2010-27788 A | | 2/2010 | |

OTHER PUBLICATIONS

Machine translation of JP2009-43975.*
K. L. Chavez and D. W. Hess A Novel Method of Etching Copper Oxide Using Acetic Acid J. Electrochem. Soc. Oct. 2001 148(11): G640-G643; doi:10.1149/1.1409400.*

* cited by examiner

*Primary Examiner* — Ibrahime A Abraham
(74) *Attorney, Agent, or Firm* — Rothwell, Figg, Ernst & Manbeck, P.C.

(57) ABSTRACT

An etching method for anisotropically etching a Cu film on a substrate surface includes providing a substrate having a Cu film on a surface thereof in a chamber and supplying an organic compound into the chamber while setting the inside of the chamber to a vacuum state and irradiating an oxygen gas cluster ion beam to the Cu film. The etching method further includes oxidizing Cu or the Cu film to a copper oxide by oxygen gas cluster ions in the oxygen gas cluster ion beam and anisotropically etching the Cu film by reacting the copper oxide and the organic compound.

5 Claims, 8 Drawing Sheets

ETCHING METHOD, ETCHING APPARATUS, AND STORAGE MEDIUM

CROSS-REFERENCE TO RELATED APPLICATION

This application claims priority to Japanese Patent Application Nos. 2011-205544 and 2012-155696 filed on Sep. 21, 2011 and Jul. 11, 2012, respectively, entire contents of which are incorporated herein by reference.

FIELD OF THE INVENTION

The present invention relates to an etching method for etching Cu film, an etching apparatus and a storage medium.

BACKGROUND OF THE INVENTION

Recently, a high-speed operation of semiconductor integrated circuit devices is being developed. The high-speed operation is realized by low resistivity of a wiring material or the like. Therefore, as for the wiring material, Cu having lower resistivity is used instead of aluminum that has been conventionally used.

Cu is not easily etched unlike aluminum. Thus, as for a technique for processing Cu wiring, there is used a damascene method for forming grooves in accordance with a wiring pattern in advance in an interlayer insulating film, forming a Cu thin film so as to fill the grooves, and chemically and physically polishing the Cu thin film by using a CMP method while leaving Cu only in the grooves.

Since, however, the damascene method has complicated processes, it is required to form a wiring by a dry etching technique as in the case of aluminum. As far a dry etching technique for Cu, there is suggested a technique for performing anisotropic oxidation on a Cu film and then dry etching the copper oxide thus formed by an organic acid (see, e.g., Japanese Patent Application Publication No. 2010-027788).

However, the technique described in Japanese Patent Application Publication No. 2010-027788 (JP2010-027788A) requires two steps including anisotropic oxidation and organic acid dry etching. In the case of etching a deep hole or trench, the anisotropic oxidation and the organic acid dry etching need to be repeated multiple times, which results in complicated processes. Since the Cu is oxidized and then etched by an organic acid, a high etching rate is not obtained. Further, a substrate needs to be heated during the organic acid dry etching, so that the apparatus configuration becomes complicated and a base may be damaged. Moreover, since a large amount of organic acid needs to be supplied, reaction efficiency becomes poor and by-products are easily produced.

SUMMARY OF THE INVENTION

In view of the above, the present invention provides an etching method and an etching apparatus for anisotropically etching Cu while ensuring a high etching rate without complicated processes and apparatus structures, and a storage medium for storing a program for practicing the etching method.

In accordance with one aspect of the present invention, there is provided an etching method for anisotropically etching a Cu film on a substrate surface, including: providing a substrate having a Cu film on a surface thereof in a chamber and supplying an organic compound into the chamber while setting the inside of the chamber to a vacuum state; irradiating an oxygen gas cluster ion beam to the Cu film; and oxidizing Cu of the Cu film to a copper oxide by oxygen gas cluster ions in the oxygen gas cluster ion beam and anisotropically etching the Cu film by reacting the copper oxide and the organic compound.

Preferably, the Cu film may be anisotropically etched continuously by supplying the organic compound into the chamber and irradiating the oxygen gas cluster ions at the same time.

Preferably, the organic material may be an organic acid or carboxylic acid.

Preferably, the Cu of the Cu film may be oxidized to a copper oxide; energy obtained from the reaction between the copper oxide and the organic compound may be supplied by heat generated by collision between the oxygen gas cluster ions and the Cu film; and etching may be performed without heating the substrate. In this case, molecules of the organic compound supplied into the chamber may be easily adsorbed onto the surface of the Cu film due to the non-heating of the substrate, and a supply amount of the organic compound may be set to obtain a vacuum state in which the oxygen gas cluster ion beam is not disturbed by the organic compound molecules.

Preferably, the temperature of the substrate may be controlled. The temperature of the substrate may be lower than or equal to a boiling point of the organic compound, or may be lower than or equal to about 90° C. Further, the temperature of the substrate may be lower than or equal to about a room temperature.

In accordance with another aspect of the present invention, there is provided an etching method for anisotropically etching a film on a substrate surface, including: providing a substrate in a chamber and setting the inside of the chamber to a vacuum state; and anisotropically etching the film by irradiating a gas cluster ion beam to the film while controlling a temperature of the substrate.

Preferably, the gas cluster ion beam may be irradiated while supplying an organic compound into the chamber. A temperature of the substrate may be lower than or equal to a boiling point of the organic compound, or may be lower than or equal to about 90° C. Further, the temperature of the substrate may be lower than or equal to about a room temperature.

In accordance with still another aspect or the present invention, there is provided an etching apparatus for anisotropically etching a Cu film on a substrate surface, including: a chamber in which a substrate having a Cu film on a surface thereof is accommodated; a substrate supporting member for supporting the substrate in the chamber; a gas exhaust unit for vacuum-exhausting the chamber; an organic compound gas supply unit for supplying an organic compound gas into the chamber; an ion beam irradiation unit for irradiating an oxygen gas cluster ion beam to the Cu film on the surface of the substrate supported on the substrate supporting member; and a moving unit for generating planar relative movement between the gas cluster ion beam and the substrate, wherein when the oxygen gas cluster ion beam is irradiated to the Cu film, Cu of the Cu film is oxidized to a copper oxide by the oxygen gas cluster ions in the oxygen gas cluster ion beam, and the Cu film is anisotropically etched by reacting the copper oxide and the organic compound.

Preferably, Cu of the Cu film may be oxidized to a copper oxide; an energy obtained from the reaction between the copper oxide and the organic compound may be supplied by heat generated by collision between the oxygen gas cluster ions and the Cu film; the substrate supporting member may be not provided with a heating unit; and etching may be performed without heating the substrate. In this case, since the substrate supporting member is provided with no heating unit, molecules of the organic compound supplied into the chamber may be easily adsorbed to the surface of the Cu film due to non-heating of the substrate; and a supply amount of the organic compound may be set to obtain a vacuum state in which the oxygen gas cluster ion beam is not disturbed by the organic compound molecules.

Preferably, the etching apparatus may further includes a temperature control unit for controlling a temperature of the substrate on the substrate supporting member. The temperature control unit may control the temperature of the substrate to be lower than or equal to a boiling point of the organic compound, or may control the temperature of the substrate to be lower than or equal to about 90° C. Further, the temperature control unit may control the temperature of the substrate to be lower than or equal to a room temperature.

In accordance with still another aspect of the present invention, there is provided an etching apparatus for anisotropically etching a film on a substrate surface, including: a chamber in which a substrate is accommodated; a substrate supporting member for supporting the substrate in the chamber; a temperature control unit for controlling a temperature of the substrate on the substrate supporting member; a gas exhaust unit for vacuum-exhausting the chamber; a gas cluster ion beam irradiation unit for irradiating a gas cluster ion beam to the film on the surface of the substrate supported on the substrate supporting member; and a moving unit for generating planar relative movement between the gas cluster ion beam and the substrate, wherein the film is anisotropically etched by irradiating the gas cluster ion beam to the film while controlling the temperature of the substrate.

Preferably, the etching apparatus further includes: an organic compound gas supply unit for supplying an organic compound gas into the chamber, wherein the temperature control unit controls the temperature of the substrate to be lower than a boiling point of the organic compound, and the gas cluster ion beam is irradiated to the film while supplying the organic compound from the organic compound gas. The temperature control unit may control the temperature of the substrate to be lower than or equal to about 90° C., or may control the temperature of the substrate to be lower than or equal to about a room temperature.

In accordance with still another aspect of the present invention, there is provided a storage medium storing a program for controlling an etching apparatus, wherein the program, when executed on a computer, controls the etching apparatus to perform the etching method disclosed in above described aspects of the present invention.

In accordance with the present invention, an oxygen gas cluster ion beam is irradiated to a Cu film on a surface of a substrate in a state where the chamber is set to an organic compound atmosphere, so that the oxygen gas cluster ion serves as an oxygen source for oxidizing Cu and a heat source for reacting the copper oxide and the organic compound. Hence, the oxidization of Cu and the reaction between the copper oxide and the organic compound can be efficiently carried out continuously. Therefore, the Cu film can be etched at an extremely high etching rate without complicated processes or apparatus configurations.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings which form a part hereof.

[First Embodiment]

<Etching Apparatus>

Figure 1:
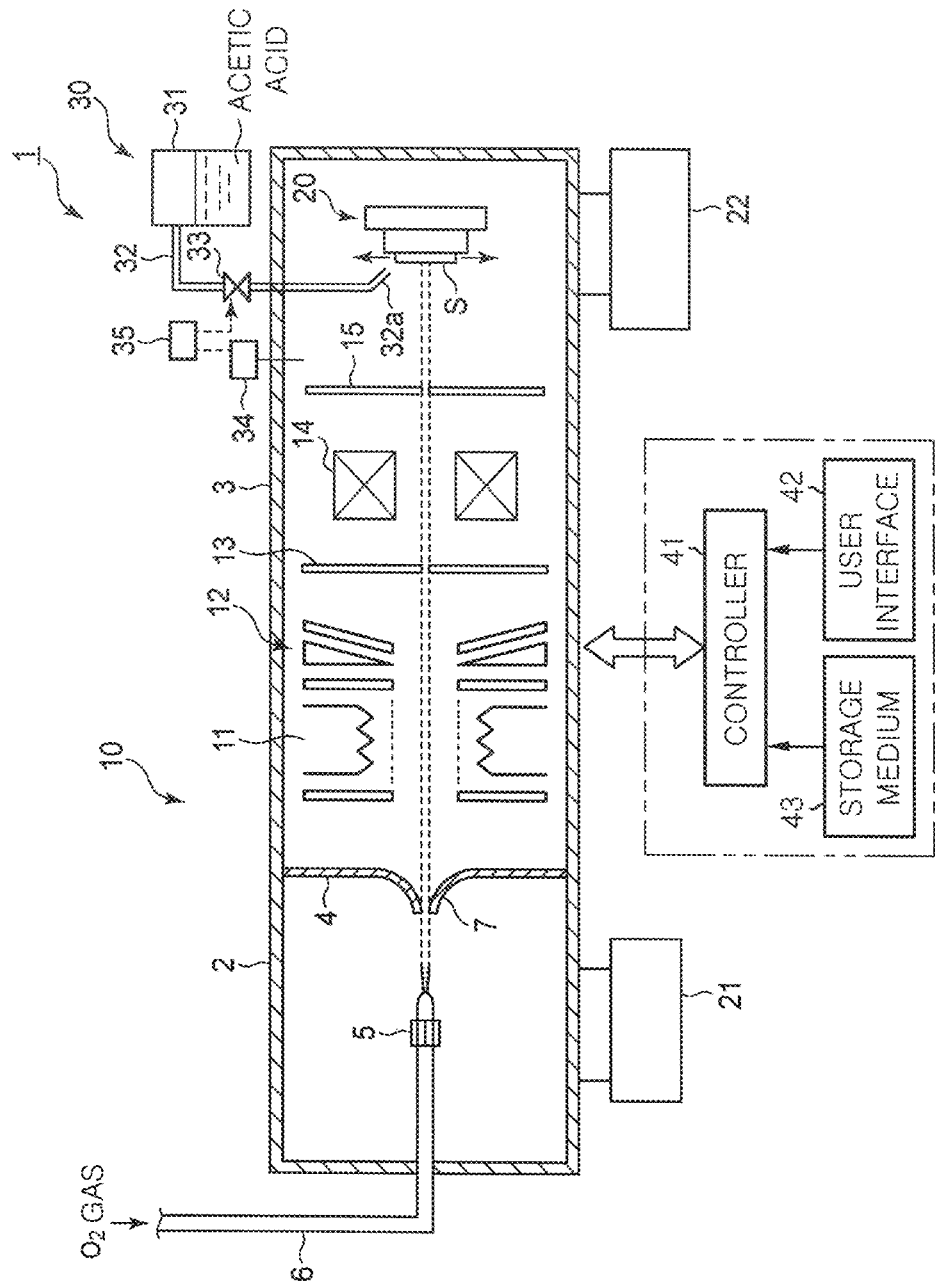
FIG. 1 shows a schematic cross sectional view of an etching apparatus in accordance with an embodiment of the invention.

FIG. 1 is a cross sectional view showing a schematic configuration of art etching apparatus in accordance with a first embodiment of the present invention. An etching apparatus 1 is configured as a gas cluster ion beam irradiation apparatus for irradiating a gas cluster ion beam (GCIB: Gas Cluster Ion Beam) to a substrate.

The etching apparatus 1 includes a source chamber 2 where a cluster stream is produced by injection of $O_2$ gas as a source gas, and a target chamber 3 where an etching reaction occurs by irradiating the cluster stream as a cluster beam to a substrate S as a target. The source chamber 2 and the target chamber 3 are separated from each other by a partition wall 4.

The source chamber 2 is provided with a nozzle 5 for injecting and clustering an $O_2$ gas stream. The nozzle 5 is connected to a line 6, and $O_2$ gas is supplied to the line 6 from a gas source (not shown) other than the source chamber 2. A pressure of the $O_2$ gas injected from the nozzle 5 is controlled by a regulator (not shown), and tens to millions of $O_2$ molecules in the ejection stream are aggregated to clusters by van der Waals force, thereby forming a cluster stream.

Further, a skimmer 7 is provided in the source chamber 7 so as to face the nozzle 5. The skimmer 7 is provided at the partition wall 4 so as to protrude toward the nozzle 5. Moreover, the skimmer 7 has an aperture through which the cluster stream injected from the nozzle 5 passes and prevents shock waves.

The cluster stream is introduced into the target chamber 3 through the aperture of the skimmer 7. An ionizer 11 formed of a plurality of annular electrodes is arranged along the cluster stream to ionize the cluster stream. An accelerator 12 is disposed at a downstream side of the ionizer 11. Therefore, the cluster stream is ionized by the ionizer 11 and accelerated by the accelerator 12. As a result, the cluster stream becomes an $O_2$ gas cluster ion beam ($O_2$-GCIB).

A first aperture 13, a permanent magnet 14 and a second aperture 15 are disposed at a downstream side of the accelerator 12. A diameter of $O_2$-GCIB is controlled by the first aperture 13 and the second aperture 15. Further, the permanent magnet 14 curves the path of cluster particles having small mass, e.g., monomer ions or cluster particles having small mass, so that $O_2$-GCIB having an appropriate size can pass through the second aperture 15.

The nozzle 5, the nozzle line 6, the skimmer 7, the ionizer 11, the accelerator 12, the first aperture 13, the permanent magnet 14 and the second aperture 15 form an $O_2$-GCIB irradiation unit 10.

An XY stage 20 is disposed at a downstream side of the second aperture 15 to hold the substrate 2 having a Cu film on a surface thereof and scan the substrate S two-dimensionally. The substrate S may be loaded into and unloaded from a loading/unloading port (not shown) disposed in the target chamber 3, and a gate valve (not shown) may be opened and closed by a gate valve (not shown). As for the substrate S, it is typical to use a semiconductor wafer represented by a silicon wafer. The XY stage 20 is not provided with a heating unit such as a heater or the like, so that the substrate S is not heated.

The source chamber 2 and the target chamber 3 are provided with vacuum pumps 21 and 22, respectively. The source chamber 2 and the target chamber 3 are evacuated by the vacuum pumps 21 and 22, so that the pressures therein are controlled to a predetermined pressure (vacuum level).

An organic compound gas is supplied from an organic compound gas supply unit 30 into the target chamber 3. Here, an acetic acid as an organic acid is used as an example of the organic compound. The organic compound gas supply unit 30 includes a reservoir 31 for storing an organic compound, a line 32 for supplying an organic compound gas vaporized in the reservoir 31 by the evacuation of the target chamber 3 to the target chamber 3, and a flow rate control valve 33 disposed on the line 32. A leading end of the line 32 is provided with a nozzle 32a for supplying the organic compound gas to the vicinity of the substrate S. However, it is unnecessary to limit the location of supplying the organic compound to the vicinity of the substrate S.

As for the organic compound, it is preferable to use one that can be supplied as it is or in a gaseous state by heating to the target chamber 3 maintained in a vacuum state. Typically, an organic acid is used. As for the organic acid, it is preferable to use a carboxylic acid represented by an acetic acid (general formula: R—COOH, R being hydrogen or straight-chain or branched-chain alkyl or alkenyl of $C_1$ to $C_{20}$, preferably methyl, ether, propyl, butyl, pentyl, or hexyl). The carboxylic acid other than the acetic acid may include formic acid (HCOOH), propionic acid ($CH_3CH_2COOH$), butyric acid ($CH_3(CH_2)_2COOH$), valeric acid ($CH_3(CH_2)_3COOH$) or the like. Among the carboxylic acids, the formic acid, the acetic acid, and the propionic acid are more preferably used. In addition, H (hfac) or the like may also be used.

The pressure in an area of the target chamber 3 where the substrate is provided is measured by a pressure gauge 34, and a pressure controller 35 controls the flow rate control valve 33 such that the pressure measured by the pressure gauge 34 becomes a predetermined value. The supply amount of the organic compound gas is set to a level that allows sufficient organic compound molecules to be adsorbed to the surface of the Cu film formed on the substrate S. The pressure in the target chamber 3 (partial pressure of acetic acid) is preferably about $10^{-4}$ Torr to $10^{-6}$ Torr. The pressure gauge 34 may be, e.g., an ion gauge or a capacitance monometer.

Figure 2:
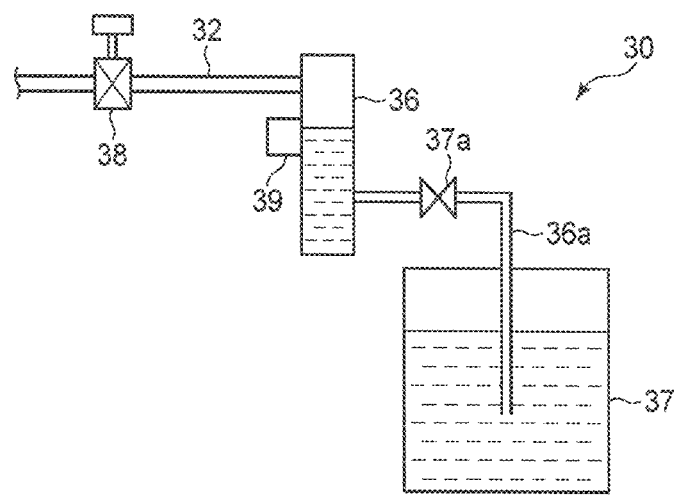
FIG. 2 shows another example of an organic compound gas supply unit in the etching apparatus shown in FIG. 1.

The organic compound gas supply unit 30 may have the configuration shown in FIG. 2. In other words, the organic compound gas supply unit 30 includes an intermediate vessel 36 and a tank 37 for storing an organic compound, and a valve 37a is disposed on a line 36a for connecting the intermediate vessel 36 and the tank 37.

The organic compound is supplied from the intermediate vessel 36 to the target chamber 3 through the line 32, and the line 32 is provided with a variable leak valve 38. The intermediate vessel 36 has a sensor for detecting the amount of the organic compound therein, e.g., a liquid surface sensor 39, so that the amount of the organic compound in the intermediate vessel 36 is measured. When the lowering of the liquid surface is detected by the liquid surface sensor 39, the intermediate vessel 36 is disconnected from the vacuum by the variable leak valve 38 and an organic compound is supplied from the tank 37 to the intermediate vessel by opening the valve 37a.

The etching apparatus 1 has a control unit 40 for controlling the entire apparatus, and the respective components are controlled by the control unit 40. Specifically, the control unit 40 performs injection control of $O_2$ gas from the nozzle 5, control of the ionizer 11, the accelerator 12 and the apertures 13 and 15, scanning control of the substrate S by the XY stage 20, the supply control of the organic acid gas, the exhaust control by the vacuum pumps 21 and 22, and the like. The control unit 40 includes a controller 41 having a microprocessor (computer), a user interface 42, and a storage unit 43. The respective components of the etching apparatus 1 are electrically connected to and controlled by the control unit 41. The user interface 42 is connected to the controller 41, and includes a keyboard through which an operator performs an input operation of commands to manage the etching apparatus 100; a display for visually displaying an operational status of each component of the etching apparatus 1; and the like. The storage unit 43 is also connected to the controller 41, and stores various database or processing recipes, i.e., control programs for performing various processes in the etching apparatus 1 under the control of the process controller 41 or control programs for performing a predetermined process in each component of the etching apparatus 1 in accordance with the processing conditions. The processing recipe is stored in a storage medium (not shown) in the storage unit 43. The storage medium may be, a fixed medium such as a hard disc or the like, or may be a portable medium such as a CD-ROM, a DVD, a flash memory, or the like. Further, the recipe may be transmitted from other devices via, e.g., a dedicated line.

Further, if necessary, a predetermined processing recipe is retrieved from the storage unit 43 in accordance with an instruction inputted through the user interface 42 and executed by the process controller 41. Accordingly, a desired process is performed in the etching apparatus 1 under the control of the process controller 41.

<Etching Method>

Hereinafter, an example of an etching method for anisotropically etching a Cu film by using the etching apparatus 1 will be described.

Figure 3:
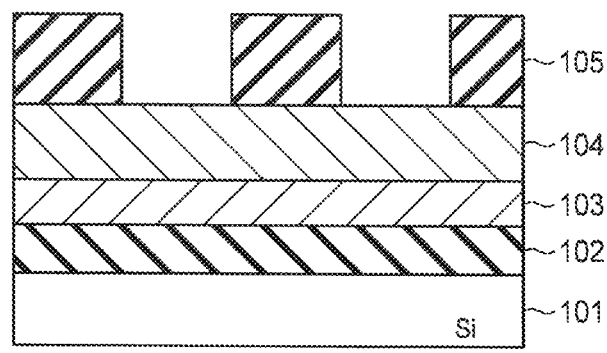
FIG. 3 schematically shows an exemplary structure of a substrate applied to an etching method in accordance with an embodiment of the invention.

First, as for a substrate S, there is used one in which an insulating film 102 such as TEOS or the like, a barrier film 103 such as Ta or the like, a Cu film 104, and an etching mask 105 are laminated in that order on a silicon 101 as described in FIG. 3. The etching mask 105 may be made of a material that is not etched even when an organic compound or $O_2$-GCIB is supplied, e.g., SiN or SiC.

The substrate S having the above-described structure is loaded through a loading/unloading port (not shown) by opening a gate valve (not shown) of the target chamber 3 and then is held on the XY stage 20. In that state, the source chamber 2 and the target chamber 3 are vacuum-evacuated by the vacuum pumps 21 and 22 and maintained in a high vacuum level.

The organic compound (acetic acid) in the reservoir 31 is evaporated by vacuum-evacuating the target chamber 3, and the evaporated organic compound is supplied to the target chamber 3. At this time, the evaporation amount of the organic compound (acetic acid) is controlled by controlling an opening degree of the flow rate control valve 33 based on the measurement value of the pressure gauge 34, and the partial pressure of the acetic acid in the target chamber 3 is controlled to a predetermined value, e.g., about $10^{-4}$ Torr to $10^{-6}$ Torr. At this time, the XY stage 20 is not provided with a heating unit and, thus, the substrate S is maintained at about a room temperature without being heated. Further, organic compound (acetic acid) molecules are adsorbed onto the surface of the substrate S, i.e., the surface of the Cu film 104.

At the same time, $O_2$ gas is injected from the nozzle 5 in the source chamber 2 to thereby form a cluster stream. The cluster stream thus formed is irradiated as $O_2$-GCIB to the substrate S supported on the XY stage 20 in the target chamber 3. At this time, as the substrate S is scanned by the XY stage 20, $O_2$-GCIB scans the surface of the substrate S.

In order to form $O_2$-GCIB, the cluster stream supplied from the source chamber 2 to the target chamber 3 is ionized by the ionizer 11 and accelerated by the accelerator 12. Further, the beam diameter of the $O_2$-GCIB is adjusted while passing through the first and the second aperture 13 and 15. Furthermore, particles having small mass are deviated from the beam path by the permanent magnet 14. Hence, the size of the cluster is properly controlled. As a result, the $O_2$-GCIB in which the beam diameter and the size of the cluster are controlled is irradiated to the substrate S.

As described above, the Cu film 104 of the substrate S is anisotropy etched by supplying acetic acid as an organic compound into the target chamber 3 and irradiating $O_2$-GCIB to the substrate S while maintaining the substrate S at a room temperature without heating.

<Mechanism and Effect of Etching>

Figure 4A:
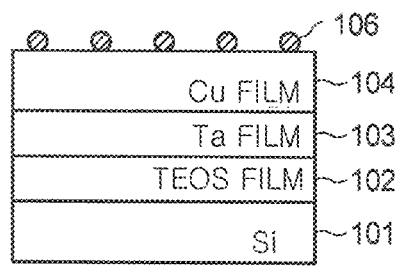
FIGS. 4A to 4C explain a mechanism of the etching method in accordance with the embodiment of the invention.
Figure 4B:
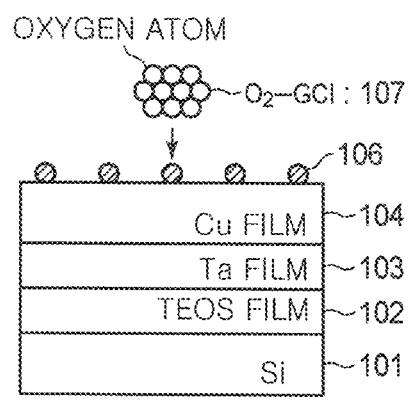
Figure 4C:
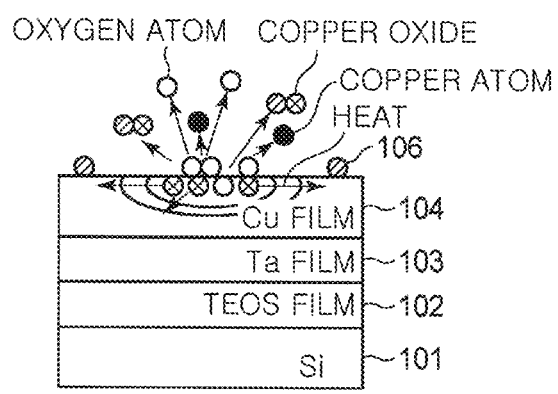

The etching mechanism used here will be described with reference to FIGS. 4A to 4C. FIGS. 4A to 4C are a schematic view for explaining a principal of an etching method in accordance with an embodiment of the present invention.

In the present embodiment, the heat required for etching the Cu film 104 is supplied by the collision of the $O_2$-GCIB, so that the substrate S is maintained at a room temperature without being heated. Therefore, the organic compound (acetic acid) supplied into the target chamber 3 is easily adsorbed, and the sufficient amount of organic compound (acetic acid) molecules 106 are adsorbed onto the surface of the Cu film 104, as shown in FIG. 4A. Accordingly, required reaction can occur even though the supply amount is small. Further, the partial pressure of the organic compound (acetic acid) in the target chamber 3 can be lowered to about $10^{-4}$ Torr to $10^{-6}$ Torr, so that the organic compound (acetic acid) can be supplied in an evaporated state at a vapor pressure without providing a heat source for evaporating the organic compound (acetic acid).

By irradiating $O_2$-GCIB in that state, $O_2$ gas cluster ions ($O_2$-GCI 107) moves straightforward toward the Cu film 104 as shown in FIG. 4b. Further, as shown in FIG. 4c, when the $O_2$-GCI 107 collides with the Cu film 104, a part of oxygen in the $O_2$-GCI 107 is turned into recoiled oxygen by the collision energy; a part of Cu on the surface is sputtered; and the other part of oxygen contributes to oxidation of Cu in formula (1). The residual collision energy is converted into heat, and the oxidation reaction in formula (1) is farther accelerated by the heat thus produced. When the organic compound is acetic acid, the reaction between copper oxide and acetic acid is accelerated, and volatile $Cu(CH_3COO)$ and $H_2O$ are generated. As a consequence, copper oxide molecules are separated from the Cu film 104. The same reaction occurs in the case of using another organic compound (organic acid) such as formic acid or propionic acid other than acetic acid. By continuously performing supply of the organic compound and irradiation of $O_2$-GCIB, the reactions of formulas (1) and (2) occur continuously without heating the substrate S. As a result, the Cu film 104 is etched.

$$2Cu + O \rightarrow Cu_2O \qquad (1)$$

$$Cu_2O + 2CH_3COOH \rightarrow 2Cu(CH_3COO)\uparrow + H_2O\uparrow \qquad (2)$$

Generally, the reaction in formula (2) generally does not occur at a room temperature. In this case, however, it occurs due to the heat produced by the collision of $O_2$-GCI.

Figure 5:
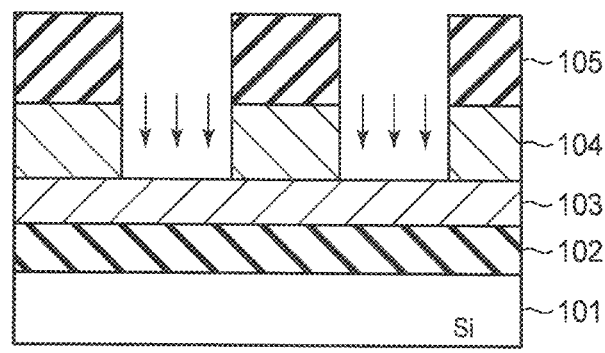
FIG. 5 schematically shows an etched state obtained by applying the etching method in accordance with one embodiment of the invention to the substrate shown in FIG. 3.

The $O_2$-GCI 107 moves straightforward during the etching, so that the Cu film 104 can be etched anisotropically and a desired etching shape corresponding to the mask 105 can be obtained as shown in FIG. 5.

In this case, $O_2$-GCI is in a state where several to tens of thousands of oxygen molecules or oxygen atoms are loosely bounded by the van der Waals force and has a large size. Therefore, when $O_2$-GCI collides with the Cu film 104, it is difficult for $O_2$-GCI to enter the Cu film 104. Therefore, the collision energy mainly acts on the surface portion of the Cu film 104 and the reaction occurs on the surface portion. Accordingly, damages inflicted on the barrier film 103 as a base of the like are extremely small. As described before, this process is basically performed at a room temperature and may be carried out even at a low pressure with a small amount of an organic compound. Therefore, the collision between the organic compound molecules and $O_2$-GCI can be ignored. Further, high reaction efficiency can be achieved because the irradiation of the $O_2$-GCI is not disturbed by the organic compound molecules.

Figure 6A:
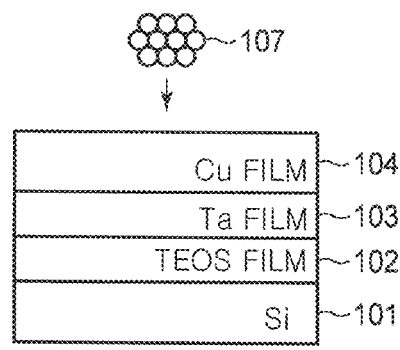
FIGS. 6A and 6B explain a mechanism in the case of etching a Cu film only by physical action of $O_2$-GCI by irradiating $O_2$-GCIB.
Figure 6B:
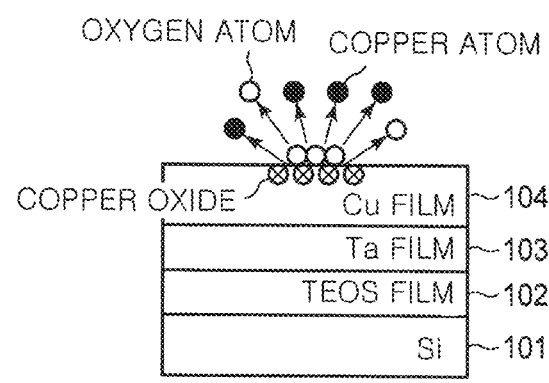

Conventionally, GCIB is used as a technique for sputtering a surface. This sputtering technique may be applied to etching of a Cu film as shown in FIG. 6. In other words, the etching may be performed by moving $O_2$-GCI 107 straightforward toward the Cu film 104 by irradiation of $O_2$-GCIB (FIG. 6A) and spattering Cu during collision with the Cu film 104 (FIG. 6B). However, in the case of etching a scaled-up semiconductor wafer having a diameter of about 300 mm and further about 450 mm by using only such physical action, a long period of time is required for the etching.

As described in JP2010-027788A, when oxidation of a Cu film and etching using an organic acid are individually performed, the processes become complicated and an etching rate is decreased. Further, a substrate needs to be heated during etching using an organic acid, and a large amount of organic acid is required. Accordingly, reaction efficiency becomes poor and by-products are easily produced.

On the other hand, in the present embodiment, as described above, $O_2$-GCIB is used as an oxygen source for oxidation of Cu and a heat source for reaction between copper oxide and an organic compound, so that the oxidation of Cu and the reaction between copper oxide and an organic compound can be continuously and efficiently carried out. Therefore, the Cu film can be etched at an extremely high etching rate without making the processes or the apparatus configuration complicated. At this time, the reaction progresses without heating the substrate. Thus, even if a small amount of organic compound is supplied, the organic compound is efficiently adsorbed onto the surface of the Cu film and the Cu film can be etched very efficiently. In addition, since the supply amount of the organic compound may be small, the amount of the organic compound adhered to the chamber wall or the generation amount of by-products are small.

The roughness on the surface of the Cu film can be lowered by performing etching by irradiating $O_2$-GCIB while supplying an organic compound. For that reason, it is advantageous in forming a wiring of a semiconductor device.

By supplying the Organic compound is sent to vicinity of the substrate S through the nozzle 32a, the reaction can occur efficiently and the adsorption of the organic compound to portions other than the surface S can be largely suppressed. In the case of supplying the organic compound gas to the vicinity of the substrate S by the nozzle 32a, a cover may be provided around the substrate S. When the organic compound is adhered to the cover, the cover may be separated for cleaning, which makes the maintenance easier.

TEST EXAMPLE

Test Example 1

A substrate on which a Cu film is formed by electroplating was provided in a target chamber. Further, acetic acid was supplied to vicinity of the substrate, and a partial pressure of the acetic acid is set to about $2\times10^{-5}$ Torr. Then, etching was performed by irradiating $O_2$-GCIB to the substrate. An accelerated voltage Va of an accelerator was set to two levels of 10 kV and 20 kV, a dose of $O_2$-GCIB was varied between about $5\times10^{15}$ (ions/cm$^2$) to $2\times10^{16}$ (ions/cm$^2$). Next, an etching depth of the Cu film was measured while varying the dose. In addition, etching was performed by irradiating $O_2$-GCIB without supplying acetic acid, and an etching depth was measured while varying the dose. The result is shown in FIG. 7.

Figure 7:
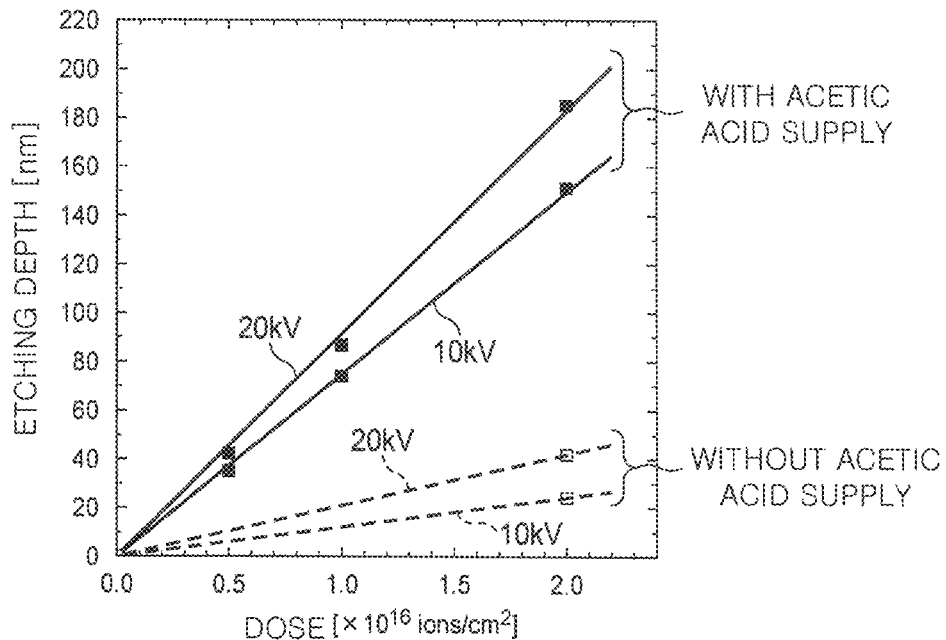
FIG. 7 shows a relationship between an $O_2$-GCIB dose and an etching depth in the case of etching a Cu film by supplying an acetic acid and irradiating $O_2$-GCIB and in the case of etching a Cu film only by irradiating $O_2$-GCIB.

As described in FIG. 7, the etching depth was increased as the dose of $O_2$-GCIB was increased. The etching depth obtained in the case of irradiating $O_2$-GCIB and supplying acetic acid was largely greater than that obtained in the case of irradiating $O_2$-GCIB without supplying acetic acid. When the $O_2$-GCIB was irradiated and the acetic acid was supplied, a very high etching rate of about 17 nm/min was obtained. However, the etching depth was hardly affected by the difference in the accelerated voltage Va.

Test Example 2

Herein, etching was performed on a substrate having a Cu film as in the test example 1 while varying a partial pressure of acetic acid. Here, the partial pressure of the acetic acid was varied between about $6\times10^{-6}$ Torr and $6\times10^{-5}$ Torr; an accelerated voltage Va of an accelerator was set to about 10 kV; and a dose of $O_2$-GCIB was set to about $1\times10^{16}$ (ions/cm$^2$). Then, an etching depth of the Cu film was measured while varying the partial pressure of the acetic acid. The result is shown in FIG. 8.

Figure 8:
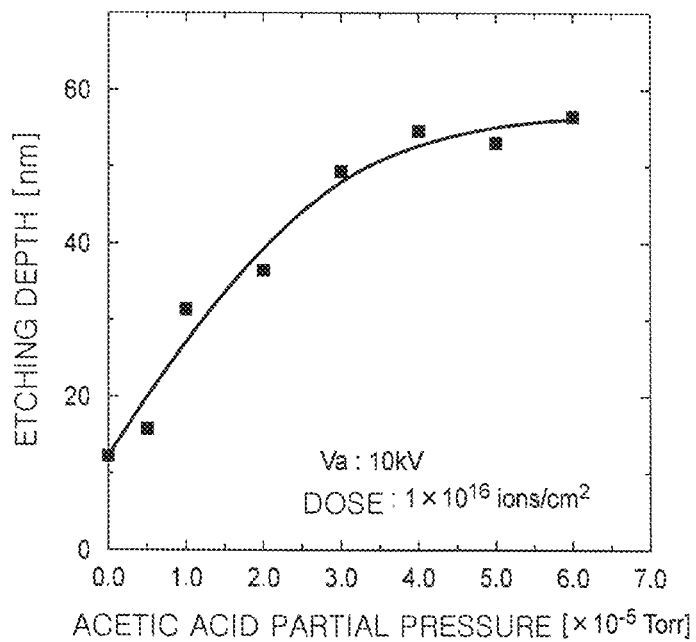
FIG. 8 shows a relationship between an acetic acid partial pressure and an etching depth in the case of etching a Cu film by irradiating $O_2$-GCIB while varying an acetic acid partial pressure.

As shown in FIG. 8, in the range where the partial pressure of the acetic acid was low, the etching depth was increased as the partial pressure of the acetic acid was increased. The etching depth was saturated when the partial pressure of the acetic acid exceeded about $2\times10^{-5}$ Torr. In other words, in the range where the etching depth was not saturated, the supply amount of the acetic acid was not sufficient. However, in the partial pressure range where the etching depth was saturated, the etching was performed in a state where the sufficient amount of acetic acid was adsorbed to the surface of the Cu film.

Test Example 3

Figure 9:
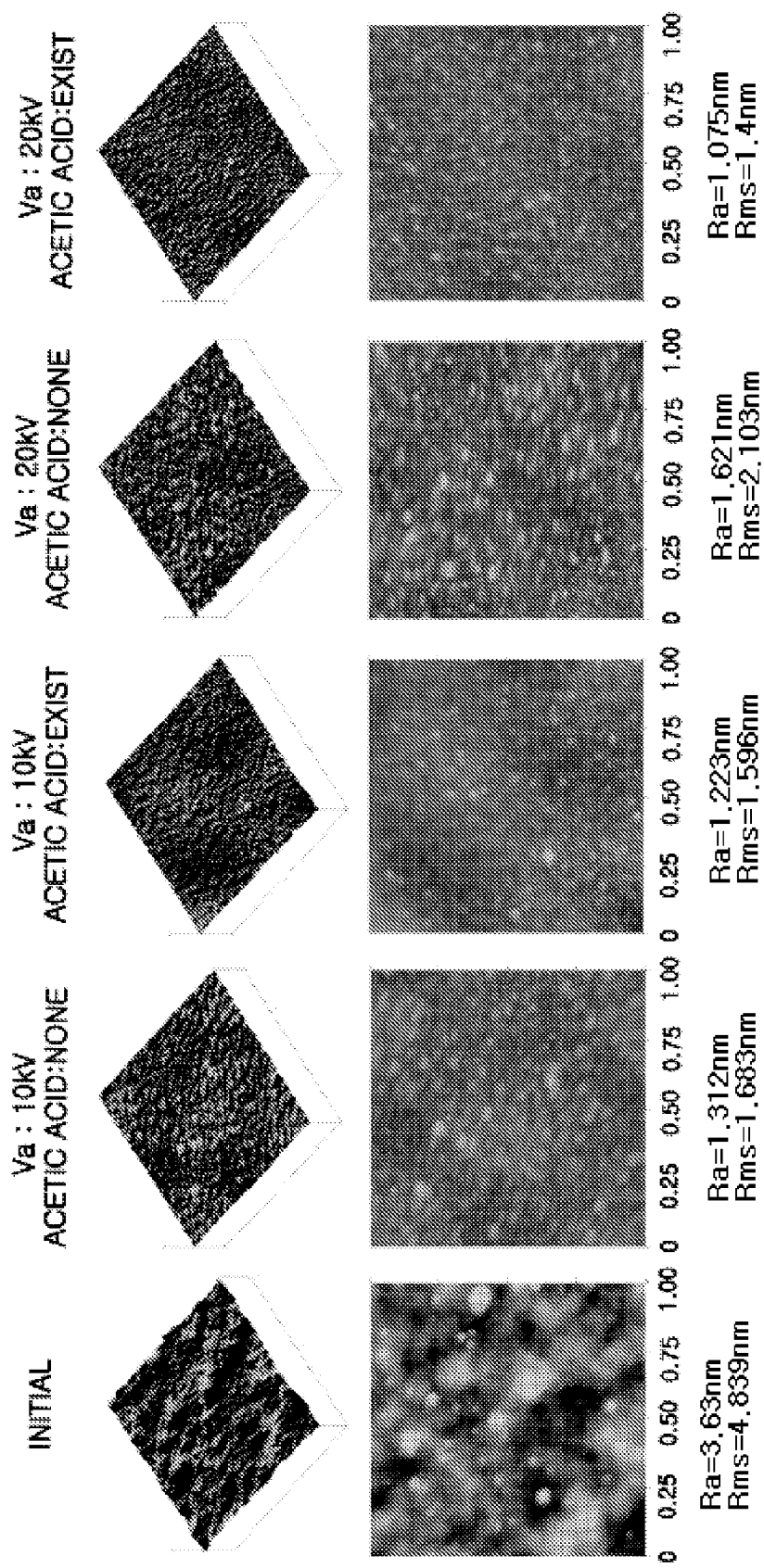
FIG. 9 shows Ra and Rms values and pictures of surface states obtained before etching (initial), in the case etching a Cu film only by irradiating $O_2$-GCIB, and in the case of etching a Cu film by supplying an acetic acid and irradiating $O_2$-GCIB.

Here, a state of a surface of about 1 μm×1 μm of a sample in which a dose of $O_2$-GCIB was set to about $1\times10^{16}$ (ions/cm$^2$) among samples of a Cu film subjected to etching as in the test example 1 was monitored by atomic force microscope. For comparison, a surface state of a Cu film before etching (initial) was monitored. The result is shown in FIG. 9. FIG. 9 shows images of surfaces of the samples and indexes (Ra, Rms) of the surface states.

As shown in FIG. 9, by irradiating $O_2$-GCIB, the surface roughness was reduced compared to that in the initial state. However, the surface roughness was further reduced by supplying acetic acid. Therefore, the present invention is advantageous in forming a wiring of a semiconductor device.

<Other Application in the First Embodiment>

In the above description, an acetic acid as an organic acid was used for the organic compound. However, based on the principal of the present invention, the same effect can be obtained even in the case of using other organic acids such as formic acid (HCOOH), propionic acid ($CH_3CH_2COOH$), butyric acid ($CH_3(CH_2)_2COOH$) and valeric acid ($CH_3(CH_2)_3COOH$) and the like. Besides, other organic compounds that can remove Cu by reaction with copper acid such as alcohol or aldehyde may also be used. Further, an apparatus for irradiating $O_2$-GCIB or irradiation conditions, and further a method for supplying an organic acid are not limited to those described in the above embodiment. For example, in the above apparatus, the XY stage was used as a substrate holding unit and the substrate holding unit was moved. However, another unit may also be applied as long as it can generate relative movement between $O_2$-GCIB and the substrate holding unit. Further, the substrate is not limited to a semiconductor wafer, and may also foe another substrate such as a flat panel display (FPD) or the like.

In the above description, the Cu film formed on the substrate is fetched by irradiating $O_2$-GCIB and supplying the organic compound thereto. However, another transition metal film such as a nickel film or the like other than the Cu film may be etched in accordance with the same principal.

Moreover, the etching may be performed by using an inorganic compound such as HF or the like instead of an organic compound. The gas used for forming a gas cluster ion beam is not limited to an oxygen gas, and may also be a gas having another oxidation effect, or a gaseous mixture of an oxygen gas or a gas having another oxidation effect and another gas.

[Second Embodiment]

An etching apparatus in accordance with a second embodiment of the present invention has basically the same configuration as that of the first embodiment except for a configuration of a stage for holding a substrate. In other words, in the first embodiment, the XY stage 20 for holding the substrate S is not provided with a temperature control unit such as a heating unit or the like. However, in the etching apparatus of the present embodiment, an XY stage 20' having a temperature control unit 50 shown in FIG. 10 is used instead of the XY stage 20 of the first embodiment in order to control the temperature of the substrate S.

Figure 10:
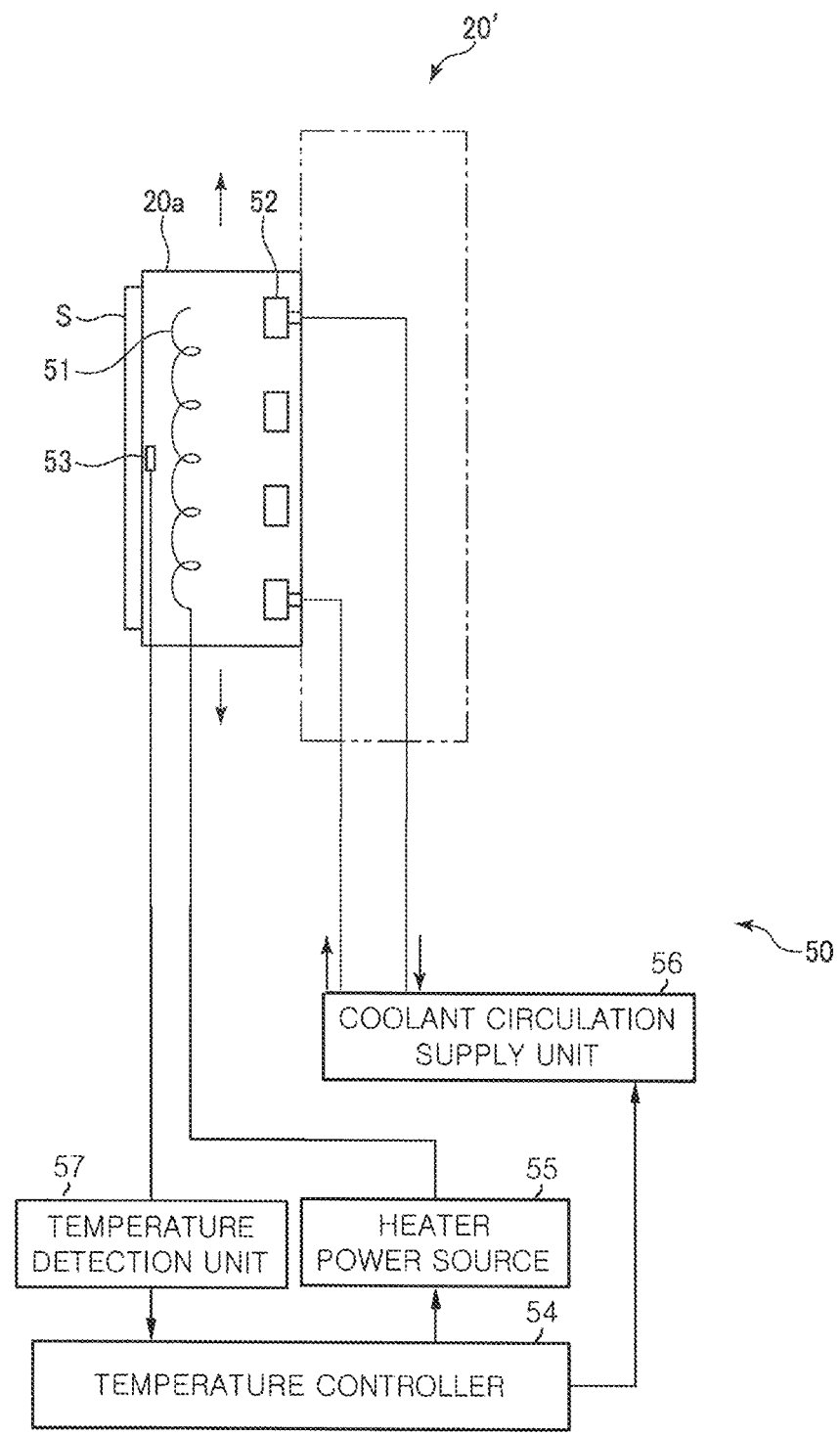
FIG. 10 shows an example of a temperature control unit used for controlling a temperature of a substrate in a second embodiment of the invention.

As shown in FIG. 10, the XY stage 20' includes a top stage 20a for holding the substrate S. The temperature control unit 50 includes a heater 51 and a coolant path 52 that are provided in the top stage 20a, a temperature sensor 53 such as a thermocouple for detecting a temperature of the substrate S, and a temperature controller 54. The signal detected by the temperature sensor 53 is transmitted to the temperature controller 54 via a temperature detection unit 57. The heater 51 is powered by a heater power source 55, and a proper coolant supplied from a coolant circulation supply unit 56 is circulated in the coolant path 52. The temperature controller 54 controls an output of the heater power source 55 and a flow rate or a temperature of the coolant medium supplied from the coolant circulation supply unit 56 based on the temperature signal from the temperature sensor 53 in order to set the temperature of the substrate S to a predetermined temperature.

As described in the first embodiment, the Cu film is oxidized by $O_2$-GCIB irradiated thereto and is anisotropically etched by reaction between the copper oxide and the organic compound such as acetic acid or the like. Therefore, heating is not required. In this etching reaction, however, an etching rate is largely changed by controlling the temperature of the substrate.

Figure 11:
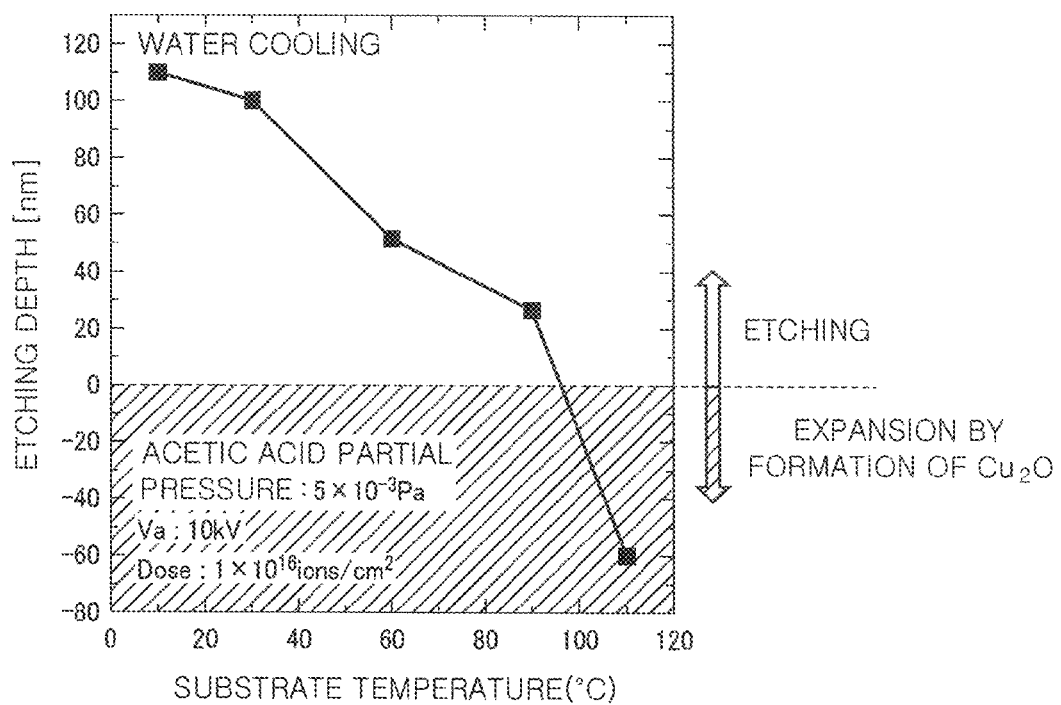
FIG. 11 shows a relationship between a temperature of a substrate and an etching depth in the case of oxidizing a Cu film by irradiating $O_2$-GCIB to the Cu film and anisotropically etching the Cu film by reacting a copper oxide and an acetic acid.

FIG. 11 shows relationship between a temperature of a substrate and an etching depth in the case of oxidizing a Cu film by $O_2$-GCIB irradiated thereto and anisotropically etching the Cu film by reaction between copper oxide and acetic acid. In this test, a partial pressure of the acetic acid was set by about $5 \times 10^{-3}$ Pa ($3.75 \times 10^{-6}$ Torr); an accelerated voltage Va of an accelerator was set to about 10 kV; and a dose of $O_2$-GCIB was set to about $1 \times 10^{16}$ (ions/cm$^2$).

As shown in FIG. 11, the etching depth was reduced as the temperature of the substrate was increased. This indicates that the etching rate is decreased as the temperature of the substrate is increased. Generally, in an etching process, the etching rate is improved as the temperature of the substrate is increased. This is because the reactivity is increased as the temperature of the substrate is increased. Although it is estimated that the same effect is obtained in the case of performing etching by irradiating $O_2$-GCIB while supplying an organic compound, the result shown in FIG. 11 is opposite to the estimation.

This is considered that the acetic acid cannot be supplied sufficiently to the substrate as the temperature of the substrate is increased. Accordingly, the effect in which the etching rate is improved by supplying the acetic acid deteriorates.

In view of such mechanism, the maximum temperature of the substrate corresponds to a boiling point of a supplied organic compound (about 118° C. in the case of acetic acid). As shown in FIG. 11, when the temperature of the substrate was about 90° C., the Cu film was etched. However, when the temperature of the substrate was about 110° C., the target film was oxidized and $Cu_2O$ was produced, which resulted in increase in the film thickness. Therefore, the temperature of the substrate is preferably about 90° C. or less. In other words, the etching can be performed at any etching rate by controlling the temperature of the substrate to be lower than or equal to about a boiling point of a supplied organic compound and more preferably lower than equal to about 90° C.

In view of increasing the etching rate, it is preferable to decrease the temperature of the substrate. By controlling the temperature of the substrate to be lower than a room temperature, i.e., about 25° C., the processing can be performed at a higher etching rate.

When the temperature of the substrate is controlled, the control method is not particularly limited, and may be linear control or stepwise control.

In the present embodiment, since the temperature of the substrate is controlled, the range of application is increased. GCIB using an inactive gas such as Ar gas or the like which does not have an oxidation effect may be used in addition to GCIB using an oxygen gas or a gaseous mixture of a gas having another oxidation effect and an oxygen gas or a gas having another oxidation effect and another gas. The etching may be performed by using an inorganic compound such as HF or the like instead of an organic compound. Further, the etching may be performed only by combination of the substrate temperature control and the GCIB. By controlling the temperature of the substrate, another transition metal film other than a Cu film, such as a nickel film or the like, may be etched. Further, the present invention may be applied to other films. Moreover, the present embodiment may be applied to the case of continuously etching multilayer films. At that time, the respective films may be etched while varying the temperature of the substrate.

In the present embodiment, the temperature of the substrate is controlled by the temperature control unit of FIG. 10. However, the temperature of the substrate may be controlled by various temperature control units. For example, temperature control only by using a heater or only by circulating a coolant medium may be carried out. Moreover, the temperature control using a thermoelectric conversion device may be performed.

In the present embodiment, the etching rata is controlled by controlling the substrate temperature. However, the etching rate may also be controlled by controlling the supply amount of the organic compound such as acetic acid or the like.

In the present embodiment as well as in the first embodiment, the substrate is not limited to a semiconductor wafer, and may be another substrate such as a FPD (flat panel display) or the like. Moreover, the etching may be performed by using an inorganic compound such as HF or the like instead of an organic compound.

While the invention has been shown and described with respect to the embodiments, it will be understood by those skilled in the art that various changes and modifications may be made without departing from the scope of the invention as defined in the following claims.

What is claimed is:

1. An etching method for anisotropically etching a Cu film on a surface of a substrate, the method comprising:

providing the substrate in a chamber and supplying a gas of an organic compound into the chamber while setting an inside of the chamber to a vacuum state, the organic compound selected from one of a carboxylic acid, aldehyde, and alcohol;

irradiating an oxygen gas cluster ion beam to the Cu film; and oxidizing Cu of the Cu film to a copper oxide by oxygen gas cluster ions in the oxygen gas cluster ion beam and anisotropically etching the Cu film by a reaction between the copper oxide and the gas of the organic compound, wherein said supplying the gas of the organic compound and said irradiating the oxygen gas cluster ion beam are carried out simultaneously, and wherein said anisotropically etching the Cu film is performed in a state where a processing temperature of the substrate is controlled to be between zero degrees Celsius and a temperature lower than or equal to a boiling point of the organic compound, wherein the organic compound remains a gas during the etching process, wherein a partial pressure of the organic compound is controlled between $10^{-6}$ torr to $10^{-4}$ torr.

2. The etching method of claim 1, wherein energy required for the reaction between the copper oxide and the gas of the organic compound is supplied by heat generated by collision between the oxygen gas cluster ions and the Cu film, and wherein said anisotropically etching the Cu film is performed without heating the substrate in addition to said heat generated by said collision.

3. The etching method of claim 1, wherein the processing temperature of the substrate is lower than or equal to about 90° C.

4. The etching method of claim 3, wherein the processing temperature of the substrate is lower than or equal to room temperature.

5. The etching method of claim 1, wherein the processing temperature of the substrate is controlled by cooling the substrate.

* * * * *